United States Patent [19]
Cha

[11] Patent Number: 5,970,329
[45] Date of Patent: Oct. 19, 1999

[54] METHOD OF FORMING POWER SEMICONDUCTOR DEVICES HAVING INSULATED GATE ELECTRODES

[75] Inventor: Seung-Joon Cha, Seoul, Rep. of Korea

[73] Assignee: Samsung Electronics Co., Ltd., Rep. of Korea

[21] Appl. No.: 08/950,324

[22] Filed: Oct. 14, 1997

[30] Foreign Application Priority Data

Dec. 28, 1996 [KR] Rep. of Korea ..................... 96-74323

[51] Int. Cl.⁶ ............................................. H01L 21/336
[52] U.S. Cl. ...................... 438/197; 438/273; 438/297; 438/301; 438/563
[58] Field of Search ................................... 438/197, 273, 438/274, 299, 301, 305, 306, 307, 286, 268, 563, 558, 297; 257/341; 148/DIG. 126

[56] References Cited

U.S. PATENT DOCUMENTS

| | | | |
|---|---|---|---|
| 4,849,367 | 7/1989 | Rouault et al. ........................ | 438/273 |
| 5,015,598 | 5/1991 | Verhaar ................................. | 438/305 |
| 5,049,512 | 9/1991 | Throngnumchai ..................... | 438/305 |
| 5,119,153 | 6/1992 | Korman et al. ........................ | 257/341 |
| 5,141,883 | 8/1992 | Feria et al. ............................. | 438/305 |
| 5,372,960 | 12/1994 | Davies et al. ......................... | 438/291 |
| 5,637,514 | 6/1997 | Jeng et al. ............................. | 438/595 |
| 5,798,550 | 8/1998 | Kurouanagi et al. .................. | 257/341 |

*Primary Examiner*—Michael Trinh
*Attorney, Agent, or Firm*—Myers Bigel Sibley & Sajovec

[57] ABSTRACT

Methods of forming power semiconductor devices include the steps of forming an insulated gate electrode on a face of semiconductor substrate containing a body region of first conductivity type (e.g., P-type) therein extending to the face. Using the gate electrode as a mask, a step is then performed to oxidize the body region and substrate at the face to form a first oxide layer. Source and drain region dopants are then implanted through the first oxide layer and into the body region and substrate to define recessed source and drain regions of second conductivity type therein, respectively. The step of implanting source and drain region dopants may be preceded by the step of etching the first oxide layer using an etching mask which covers the gate electrode. The step of oxidizing the body region and substrate may also be preceded by the step of forming nitride spacers on sidewalls of the gate electrode and then also using the nitride spacers as a mask during the oxidation step. These nitride spacers are then removed prior to performing the step of implanting the source and drain region dopants.

10 Claims, 4 Drawing Sheets

METHOD OF FORMING POWER SEMICONDUCTOR DEVICES HAVING INSULATED GATE ELECTRODES

FIELD OF THE INVENTION

The present invention relates to methods of forming semiconductor switching devices and devices formed thereby, and more particularly to methods of forming semiconductor-on-insulator (SOI) switching devices and devices formed thereby.

BACKGROUND OF THE INVENTION

Future intelligent power ICs will require high-density power devices along with analog functions and VLSI logic. DMOS transistors are important in power device applications capable of handling high voltages. For such devices, one figure of merit is the current handling capacity per unit area or the ON resistance per unit area. For a given voltage rating, the ON resistance per unit area may be reduced by reducing the cell area of the MOS device. In the field of power transistors, the combined width of the polycrystalline silicon (polysilicon) and the contact region, which forms the gate and source electrode, respectively, is defined as the cell pitch of the device. For a DMOS power transistor, a known technique to reduce the width of the polysilicon region is to decrease the P-well junction depth. However, minimum junction depth is defined by the breakdown voltage required.

A conventional lateral DMOS (LDMOS) device is typically well suited for incorporation into VLSI processes because of its simplicity. However, LDMOS devices have been considered inferior to vertical DMOS (VDMOS) devices, and therefore have not received significant attention. Recently, a RESURF (Reduced SURface Field) LDMOS device with good specific on-resistance ($R_{sp}$) has been demonstrated. But that device structure is more complex and not very versatile because it is typically limited to grounded source applications. More specifically, in the past, DMOS transistors have been utilized either as discrete power transistors or as components in monolithic integrated circuits. DMOS transistors are inherently conservative of semiconductor substrate area because of the manner in which they are fabricated in a self-aligned fabrication sequence. A channel body region is usually formed first by introduction of one type of dopant (P or N impurities) through an aperture in a mask of gate-forming material. This provides a channel region which is self-aligned to the gate electrode. Then a source region is usually formed by dopant introduction of a type opposite to that of the channel body region through the existing aperture so that the source is self-aligned to both the gate electrode and the channel body region. This permits a very compact structure.

Referring now to FIGS. 1A and 1B, a conventional method for fabricating a typical DMOS transistor is described. First, as shown in FIG. 1A, a field oxide layer 2 is formed on a P-type semiconductor substrate 1 according to a well-known LOCOS (local oxidation of silicon) process in the art. Then, a layer 4 of oxide (silicon dioxide) is preferably thermally grown or deposited over the surface of the substrate 1 including over the substrate surface. This oxide layer 4 will preferably and subsequently serve as the gate insulator of the completed DMOS device. Next, 5000 Å of polycrystalline silicon, for example, may be deposited on the insulating layer 4 and patterned, preferably by a conventional photolithographic masking and etching technique, to yield one or more conductive gate electrode regions 5 with each gate electrode region 5 serving as the gate electrode for a completed DMOS device. Also on the substrate, a photoresist layer is deposited and patterned to form a body forming mask 6. A P-type body region 8 is formed in the surface of the P-type substrate 1 by, for example, conventional photolithographic masking, etching and diffusion techniques using a P-type dopant source 7 such as boron.

Particularly, so as to render high conductivity to the gate electrode regions 5, a $POCl_3$ doping or a ion implantation step has been used before performing a heat treatment step at high temperature. If desired, ion implantation techniques can be used to form the P-type body 8. The number of P-type bodies formed depends on whether a discrete DMOS device is being formed or whether one or more DMOS devices are being used as unit cells of an integrated circuit power device. The P-type body 8 doped with P-type dopants will eventually be used as the high conductivity (i.e., low resistivity) contact regions for the body channel of the completed DMOS device.

However, during fabrication of such a DMOS device using $POCl_3$ doping and heat treatment (particularly for power devices), there arise at least two problems. One of the problems is that the channel region in the P-type body 8 has a nonuniform doping profile. This is because the P-type impurity injected into the gate electrode region 18 is diffused downwardly and laterally during the formation of the P-type body 8 and an $N^+$ drain/source region therein. More particularly, a region of the P-type body which is nearly adjacent to the drain region has a rather low concentration of impurities therein. As a result, if an increased drain voltage is applied to the completed DMOS device, the drain region which is nearly adjacent to the channel region is easily depleted and susceptible to punchthrough. Accordingly, the electrical characteristics of the completed DMOS device, particularly the withstand voltage, can be seriously degraded.

In order to prevent the above described withstand voltage from being lowered, it is typically necessary to increase the channel length between the P-type body and the source region. This, however, increases the lateral dimensions of the DMOS device and reduces integration density. The other of the problems is that it is difficult to make the gate polysilicon have high conductivity by diffusing an N-type conductive source such as, $POCl_3$, $WSi_x$, or the like. This is because the P-type body 8 is previously formed by doping with P-type impurities before diffusion of the conductive N-type source in the gate polysilicon. If the conductive gate is formed by diffusion of $POCl_3$, an additional masking layer may be necessary to block P-type impurities during formation of the conductive gate. Also, when the conductive gate is formed without the use of such an additional masking layer, an impurity ion implantation step may need to be performed in place of the diffusion of $POCl_3$. In the event an ion implantation step is performed, the resistance of the conductive gate may be undesirably increased. When diffusion of $WSi_x$ is used, an additional problem associated with lift-off may occur.

Moreover, if an ion implantation step for forming the P-type body is performed before forming a gate electrode region, there may arise a problem of misalignment during the formation of the P-type body. Such misalignment may degrade the electrical characteristics of the DMOS device. Additionally, it is typically necessary to form a very low-resistance channel between the channel body region and the source region to prevent undesired parasitic transistor action that may occur if the source/body P-N junction becomes forward biased at high current levels. Because the channel body region is lightly doped, and a low resistance electrical contact to a semiconductor region typically requires a heavily-doped surface region, it is necessary to provide an auxiliary heavily doped contact region for the channel body region to insure good electrical contact to both the source and body regions. Such a heavily doped body region usually cannot be self-aligned and hence there may be an increase in the overall size of the DMOS device. Typically, the heavily doped body contact region is formed before the other two regions. Then a rather thick masking oxide layer is used to protect the heavily doped body contact region against the source region dopant. The necessity to etch away or remove this masking oxide layer together with any oxide over the source regions, without disturbing the insulator over and/or under the gate electrode, increases fabrication costs, tolerances, and process complexity and, as a result, decreases the yields of electrically good devices.

While various processes having been utilized in an attempt to ameliorate the foregoing problems, there still exists a need to provide improved DMOS fabrication methods and process sequences.

SUMMARY OF THE INVENTION

It is therefore an object of the present invention to provide improved methods of forming power semiconductor devices.

It is another object of the present invention to provide methods of forming power semiconductor devices having improved gate electrodes.

It is still another object of the present invention to provide methods of forming power semiconductor devices having recessed source and drain regions.

These and other objects, advantages and features of the present invention are provided by methods of forming power field effect transistors which include the steps of forming an insulated gate electrode on a face of semiconductor substrate containing a body region of first conductivity type (e.g., P-type) therein extending to the face. Using the gate electrode as a mask, a step is then performed to oxidize the body region and substrate at the face to form a first oxide layer. Source and drain region dopants are then implanted through the first oxide layer and into the body region and substrate to define recessed source and drain regions of second conductivity type therein, respectively. The step of implanting source and drain region dopants may be preceded by the step of etching the first oxide layer using an etching mask which covers the gate electrode. The step of oxidizing the body region and substrate may also be preceded by the step of forming nitride spacers on sidewalls of the gate electrode and then also using the nitride spacers as a mask during the oxidation step. These nitride spacers are then removed prior to performing the step of implanting the source and drain region dopants.

According to a preferred embodiment of the present invention, methods of forming lateral insulated-gate field effect transistors are provided which include the steps of forming a first electrically insulating layer on a face of a semiconductor substrate and then forming a gate electrode on the first electrically insulating layer, opposite the face. Dopants of first conductivity type are then implanted into the substrate to define a body region of first conductivity type therein, using the gate electrode as an implant mask. First spacers are then formed on sidewalls of the gate electrode. A portion of the body region of first conductivity type is then thermally oxidized at the face, using the gate electrode and first spacers as an oxidation mask. Dopants of second conductivity type are then implanted through the thermally oxidized portion of the body region and into the substrate to define a recessed source region of second conductivity type in the body region. A contact hole extending through the thermally oxidized portion of the body region is then formed to expose the source region and then a contact region of first conductivity type is formed in the source region. The conductivity of the gate electrode may also be increased by depositing a layer of POCL$_3$ on the gate electrode and then diffusing phosphorus from the POCL$_3$ layer into the gate electrode.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types. Like numbers refer to like elements throughout.

Figure 1A:
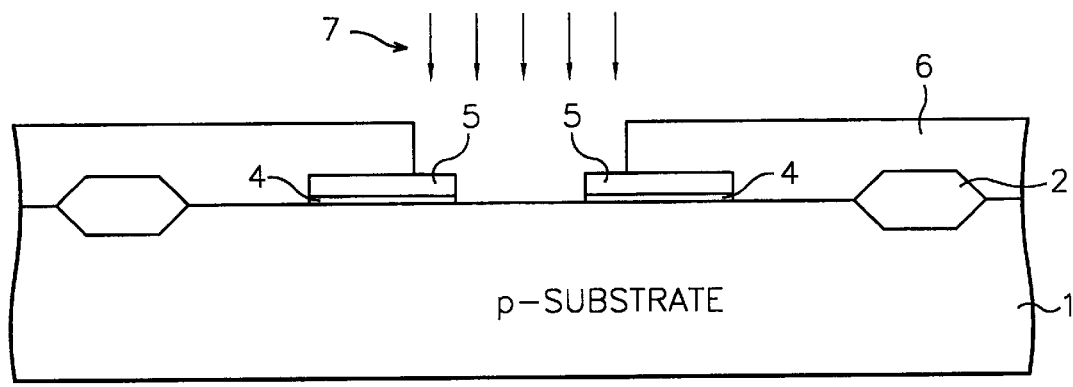
FIGS. 1A-1B illustrate cross-sectional views of intermediate structures that illustrate a method of forming a semiconductor switching device according to the prior art.
Figure 1B:
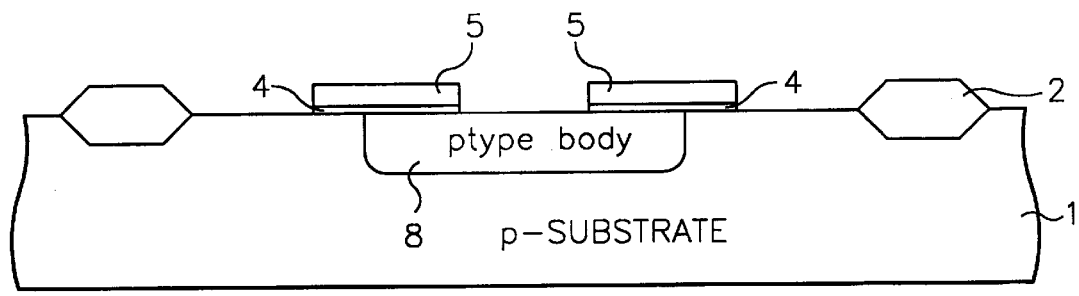
Figure 2A:
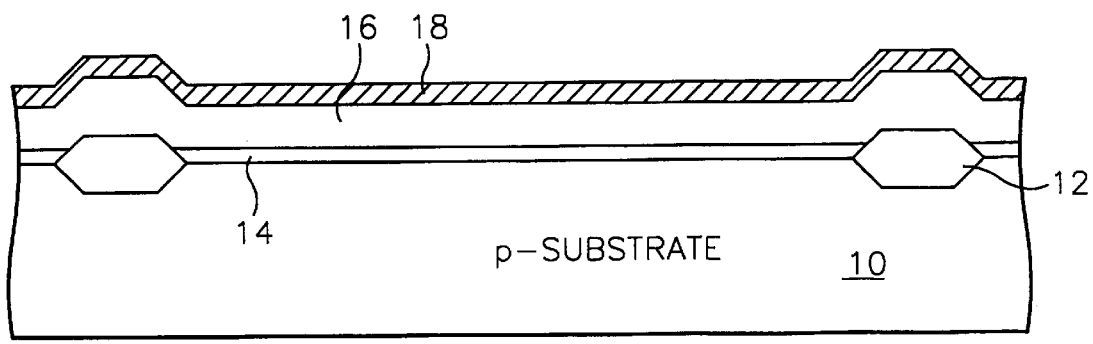
FIGS. 2A–2I illustrate cross-sectional views of intermediate structures that illustrate a method of forming a semiconductor switching device according to an embodiment of the present invention.

Referring now to FIGS. 2A–2I, preferred methods of forming DMOS power devices will be described. In particular, as illustrated by FIG. 2A, a P-type semiconductor substrate 10 is provided with an isolation region 12 of silicon oxide provided thereon. The isolation region 12 is provided to electrically separate DMOS elements from each other. Generally, the isolation region 12 is formed of a high dielectric material, using well-known isolation processes such as LOCOS (Local Oxidation of Silicon).

In this example, the substrate 10 is of P-type conductivity (e.g., a 10 to 20 Ω-cm substrate). As will be understood by those skilled in the art, the substrate configuration is not critical to the present invention and may be provided by a semiconductor layer (not shown) or an epitaxially deposited layer (not shown) provided thereon. In this case, either the semiconductor layer or the epitaxially deposited layer can be electrically isolated by the isolation region 12. As a more detailed example, an epitaxial layer or N-type material is deposited on a P-type substrate to form a semiconductor layer (not shown) on the substrate and then the isolation region 12 of silicon oxide is formed by an isolation type process, so that portions of the semiconductor layer are electrically isolated by the isolation region 12.

Referring again to FIG. 2A, a layer 14 of oxide (silicon dioxide) is preferably thermally grown or deposited over the surface of the substrate 10. This oxide layer 14 will preferably serve as the gate insulator of the completed DMOS transistor. Subsequently, on the insulating layer 14, a layer 16 of about 5000 Å of polycrystalline silicon ("polysilicon") is deposited. Then an insulating layer 18 of about 2000 Å of silicon nitride is formed on the polysilicon layer 16.

Figure 2B:
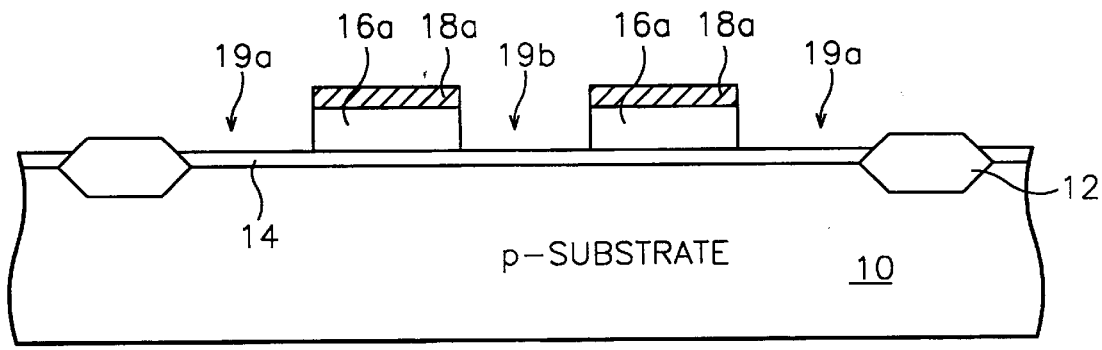

Referring next to FIG. 2B, the insulating layer 18 is patterned, preferably using well-known photolithographic masking and etching techniques, leaving one or more portions 18a of the insulating layer 18. The polysilicon layer 16 is then patterned by a well-known etching technique using the insulator portions 18a as a mask, to define drain and source windows 19a and 19b.

Figure 2C:
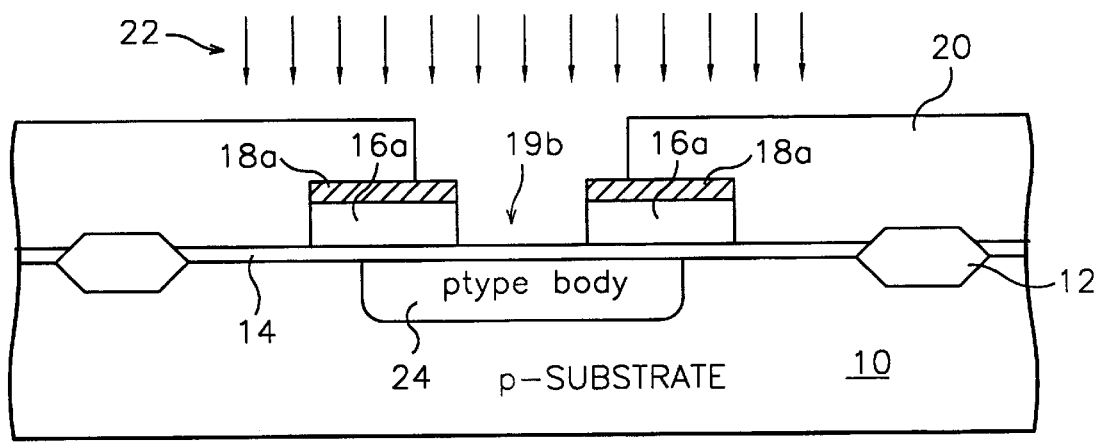

Proceeding now to FIG. 2C, a photoresist layer is deposited on the substrate structure and patterned by a photolithographic masking and developing technique, leaving one or more portions 20 of the photoresist layer to open the source window 19b only. Namely, the photoresist portions 20, which serve as a masking layer, are formed over drain windows 19a. In this example, the masking layer typically can be any photolithography masking layer. Next, a P-type dopant is introduced through the source window 19b formed by the masking layer 20. A suitable P-type dopant 22, such as boron, is most conveniently and accurately introduced by ion implantation through the insulating layer 14. The dopants 22 are then driven into the substrate 10 by a heat treatment step at high temperature in order to form a lightly doped P-type body region 24. Because of lateral diffusion which occurs during the drive-in diffusion operation, the lightly doped P-type body 24 extends outwardly (under the gate oxide layer 14 that is under the undoped gate polysilicon layer 18a) thereby providing an optimum channel region for the N channel DMOS device that is ultimately formed.

Figure 2D:
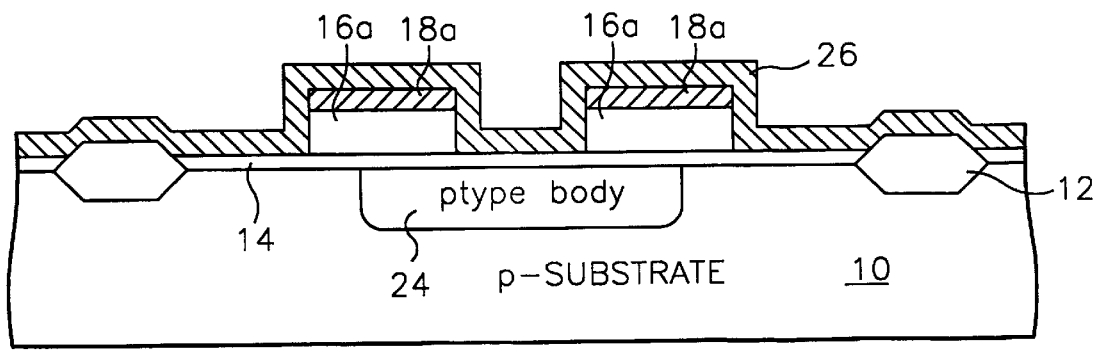
Figure 2E:
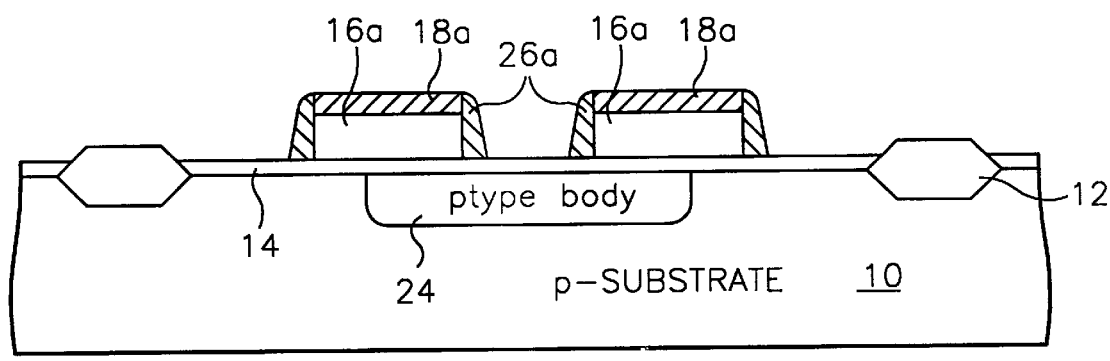

Referring now to FIGS. 2D and 2E, after the masking layer 20 is removed, a thin insulating layer 26, preferably containing nitride (such as a $Si_3N_4$), is formed over all portions of the surface of the semiconductor substrate and then partially removed by a dry etching process so that sidewall insulating regions (or, spacers) 26a are formed on each of the combined sidewalls of the gate polysilicon layer and the insulating layer 18a. Alternatively, the sidewall regions 26a may comprise an oxide and may be formed using a TEOS (tetraethoxysilane) process. The insulating layer 18a serves as a mask during formation of the sidewall regions 26a. Also the insulating layer 14 serves as an etch stop during the formation of the sidewall regions 26a.

Figure 2F:
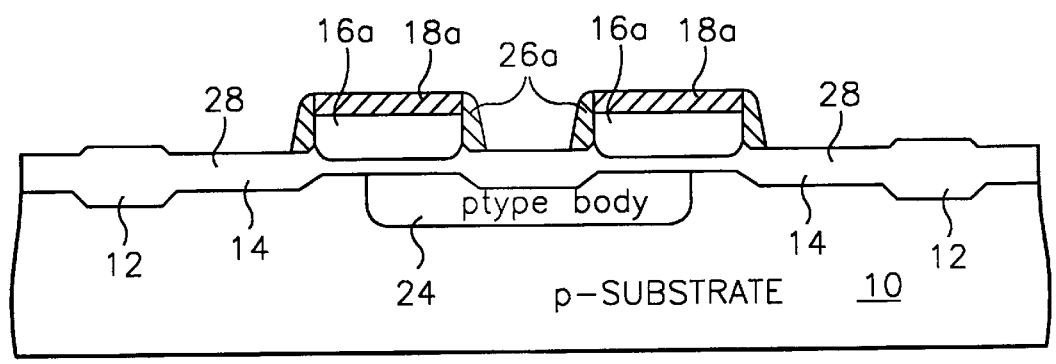

As illustrated in FIG. 2F, an oxidizing operation is then carried out to grow an oxide layer 28 on the exposed portions of the gate oxide layer 14 and the field oxide layer 12. The combined region of the insulating layer 18a and the sidewall regions 26a serves as an oxidation mask during the oxide growth. The insulating layer 12 is formed thicker at the exposed portions of the gate oxide layer 14 which corresponds to the drain and source regions of the completed DMOS device. These thick portions are formed to enhance the withstand voltage of the completed DMOS device.

Figure 2G:
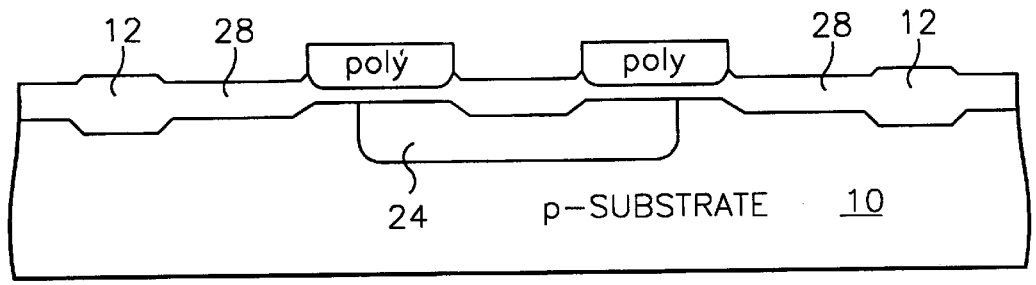

Referring now to FIG. 2G, after the insulating layer 18a and the sidewall regions 26a are removed, a $POCl_3$ solution is applied to cover the surface of the semiconductor substrate and then a diffusion/drive-in heat treatment step is carried out. During the course of this heat treatment step, the phosphorus in the $POCl_3$ film or layer (not shown) is transferred or conveyed directly into the gate polysilicon layer 16a so that the gate polysilicon layer 16a has increased conductivity. However, the phosphorus does not penetrate through the thick oxide layer 28 into the substrate.

Figure 2H:
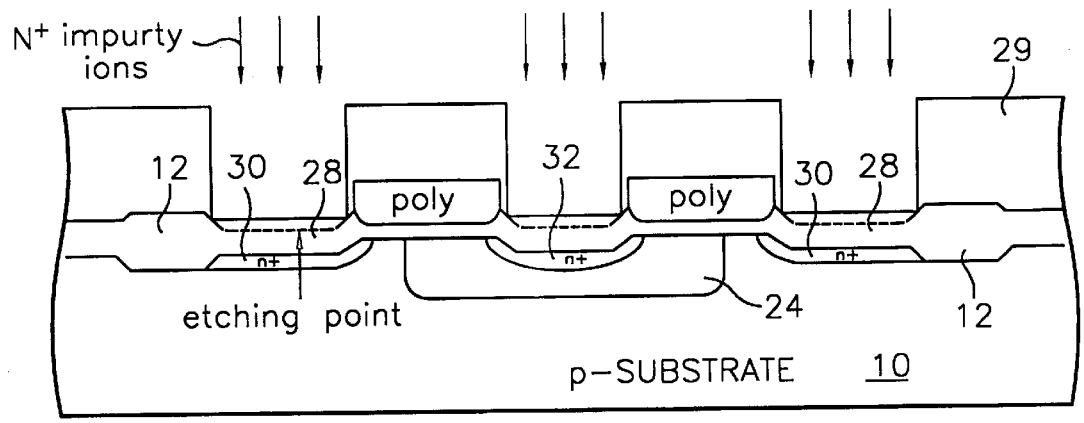

Next, as shown in FIG. 2H, a photoresist layer or a nitride layer is deposited and patterned by photolithography to form a masking layer 29 having a source/drain window therein which defines a source/drain region. During the step of patterning the masking layer 29, the oxide layer 28 also continues to be partially removed until an etching point (shown by a broken line of FIG. 2H) is exposed. Subsequently, an $N^+$ ion implantation step is performed (using the masking layer 29 as a mask) to form the heavily doped N+ drain region 30 and the heavily doped N+ source region 32.

Figure 2I:
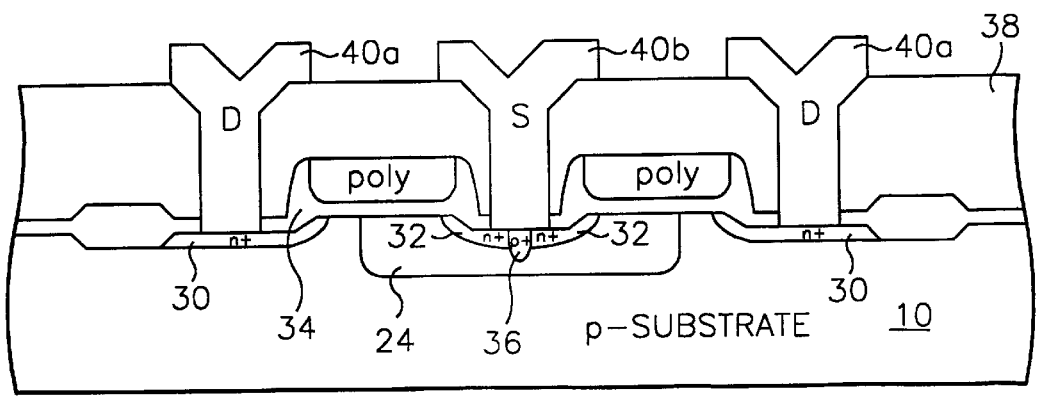

As shown in FIG. 2I, an insulating layer is formed over all portions of the surface of the semiconductor layer and then selectively removed by a conventional dry etching process to thereby define sidewall spacer regions 34 on both sidewalls of the gate polysilicon 16a. These sidewall regions 34 typically comprise an oxide such as silicon dioxide, or a nitride such as a $Si_3N_4$. During formation of the sidewall regions 34, the combined oxide layer on the drain and the source regions 30 and 32 becomes thinner. Next, the oxide layer on the source region 32 is partially removed to form a contact window. A diffusion process is then performed to form a heavily doped P+ body contact region 36 through the source region 32.

Finally, a metallization process is used to form the conductive layers 40a and 40b to complete the structure illustrated in FIG. 2H. An insulating layer 38, such as silicon dioxide, is then deposited over the device and conductive contacts and interconnect lines are formed to electrically couple the DMOS device to other devices on the integrated circuit.

As described above, according to a novel method for fabricating a DMOS transistor, a uniform provision of impurity concentration in the channel region of the P-type body and in the source/drain region can be obtained so that device characteristics, particularly the withstand voltage of the DMOS transistor, can be improved. Also, the method can prevent depletion at part of the P-type body, which is nearly adjacent to the drain region, from being generated. Therefore, even though an increased drain voltage is applied to the completed DMOS device, substantial depletion of the channel region does not occur which means the likelihood of punchthrough is reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a transistor, comprising the steps of:

forming an insulated gate electrode on a face of a semiconductor substrate of first or second conductivity type;

implanting dopants of second conductivity type into the semiconductor substrate to define a body region of second conductivity type therein, using the insulated gate electrode as an implant mask;

forming first spacers on sidewalls of the insulated gate electrode;

thermally oxidizing the body region using the first spacers as an oxidation mask;

removing the first spacers;

incorporating first dopants of first conductivity type into the insulated gate electrode, using a thermally oxidized portion of the body region as a dopant mask which inhibits transfer of first dopants into the body region; then etching the thermally oxidized portion of the body region to reduce the thickness thereof; then implanting second dopants of first conductivity type through the thermally oxidized portion of the body region and into the body region to define a source region therein; and then etching the thermally oxidized portion of the body region to expose the source region.

2. The method of claim 1, wherein said step of etching the thermally oxidized portion of the body region to expose the source region is preceded by the step of forming second spacers on sidewalls of the insulated gate electrode.

3. The method of claim 2, wherein the first spacers comprise silicon nitride and the second spacers comprise silicon dioxide.

4. The method of claim 1, further comprising the step of forming a body contact region of second conductivity type which forms rectifying and nonrectifying junctions with the source and body regions, respectively.

5. The method of claim 1, wherein the insulated gate electrode comprises a polycrystalline silicon gate electrode; and wherein said step of incorporating first dopants into the insulated gate electrode comprises exposing the gate electrode to a $POCL_3$ solution.

6. A method of forming a lateral insulated-gate field effect transistor, comprising the steps of:

forming an insulated gate electrode on a face of a semiconductor substrate of first or second conductivity type;

implanting dopants of second conductivity type into the semiconductor substrate to define a body region of second conductivity type therein, using the insulated gate electrode as an implant mask;

forming first spacers on sidewalls of the insulated gate electrode;

thermally oxidizing the semiconductor substrate and the body region using the first spacers as an oxidation mask;

removing the first spacers;

incorporating first dopants of first conductivity type into the insulated gate electrode, using a thermally oxidized portion of the body region as a dopant mask which inhibits transfer of first dopants into the body region; then etching the thermally oxidized portion of the body region to reduce the thickness thereof; then implanting second dopants of first conductivity type through the thermally oxidized portion of the body region and through a thermally oxidized portion of the semiconductor substrate to define a source region in the body region and a drain region external to the body region; and then etching the thermally oxidized portion of the body region and the thermally oxidized portion of the semiconductor substrate to expose the source and drain regions.

7. The method of claim 6, wherein said step of etching the thermally oxidized portion of the body region to expose the source region is preceded by the step of forming second spacers on sidewalls of the insulated gate electrode.

8. The method of claim 7, wherein the first spacers comprise silicon nitride and the second spacers comprise silicon dioxide.

9. The method of claim 6, further comprising the step of forming a body contact region of second conductivity type which forms rectifying and nonrectifying junctions with the source and body regions, respectively.

10. The method of claim 6, wherein the insulated gate electrode comprises a polycrystalline silicon gate electrode; and wherein said step of incorporating first dopants into the insulated gate electrode comprises exposing the gate electrode to a $POCL_3$ solution.

* * * * *